United States Patent [19]

Pommerrenig

[11] 4,350,886
[45] Sep. 21, 1982

[54] MULTI-ELEMENT IMAGER DEVICE
[75] Inventor: Dieter H. Pommerrenig, El Toro, Calif.
[73] Assignee: Rockwell International Corporation, El Segundo, Calif.
[21] Appl. No.: 126,134
[22] Filed: Feb. 25, 1980
[51] Int. Cl.³ .............................................. H01J 5/02
[52] U.S. Cl. .................................... 250/239; 250/578
[58] Field of Search ............... 250/211 R, 211 J, 578, 250/239; 357/24, 29, 30, 31, 32

[56] References Cited

U.S. PATENT DOCUMENTS

| | | | |
|---|---|---|---|
| 3,165,634 | 1/1965 | Raymond | 250/578 |
| 3,593,067 | 7/1971 | Flynn | 357/32 |
| 3,624,462 | 11/1971 | Phy | 357/32 |
| 3,863,065 | 1/1975 | Kosonocky et al. | 250/578 |
| 4,206,470 | 6/1980 | White | 357/30 |

*Primary Examiner*—David C. Nelms
*Attorney, Agent, or Firm*—Harold C. Weston

[57] ABSTRACT

A multi-element imager device (MEID) utilizes a plurality of radiation sensitive imager chips fixed to a stratum of transparent material, said stratum supporting buses and other conductors as well as associated electronics are arranged so that dead space in the image plane is minimal, the device being highly reliable and readily producible.

14 Claims, 8 Drawing Figures

MULTI-ELEMENT IMAGER DEVICE

BACKGROUND OF THE INVENTION

1. Field of the Invention

"Imager devices", or "image sensors" as used herein shall refer to devices which are sensitive to electromagnetic radiation and which, in conjunction with electrical means, provide electrical signals indicating presence of such radiation. Their principal application may well be found in providing electrical signals directly relatable to visual images. This invention relates to imager devices and more particularly to a multi-element imager device (MEID) comprised of a plurality of imaging charge coupled devices (ICCD's) mounted to and supported by a stratum of material with selectable coefficient of optical transmissivity through which, target, or image, energy passes to activate sensing elements of such ICCD's. Such MEID's find application as focal planes in high resolution television cameras or surveillance systems in places inaccessible to human operators (e.g. space satellites or nuclear reactors). High sensitivity of the component ICCD's makes the MEID especially valuable where light intensity from the target source is low. Use of such radiation sensitive devices with the particular transmissivity of a selected supporting stratum allows accurate reproduction of images in the sensed wavelength region of the spectrum while providing protection of the devices from X-rays, lasers, and harmful radiation to which the stratum is opaque.

This supporting stratum may also carry signal, power and timing buses to enable close packing of ICCD's in a reliable, readily producible configuration minimizing "dead" or unused space in the sensing plane. "Sensing plane", as used in this disclosure, shall mean that plane formed by the active surface of the radiation sensitive device when mounted to its supporting stratum.

2. Description of the Prior Art

Image sensor chips are manufactured in a variety of configurations, all directed toward the same general purpose, so that when "ICCD" or "radiation sensitive device" is used in this disclosure, it shall be understood that any device capable of presenting electrical signals corresponding to radiation in the sensing plane is comprehended. Charge coupled devices are in widespread use throughout modern industry and the within invention was reduced to practice utilizing such units. Any device, however, providing electrical signals corresponding to visual or optical images over its sensing surface is equivalent to the "ICCD's" referred to herein. ICCD's may also be useful for sensing and converting radiation outside the visible spectrum.

Image sensors are utilized in television cameras and other electro-optic systems to convert a visual presentation on the sensor's surface into a serial pulse train of electrical signals. The pulse train is then processed and conditioned for whatever purpose is to be made of information contained therein including remote reproduction of the sensed image. When the within MEID is used for image reproduction as part of an electro-optical depiction system, it will be placed in the focal plane of an optics system comprised of lenses, collimators, etc. Multiplexers associated with the component ICCD's convert the image sensed in such a focal plane to a train of pulses. The amplitude of which pulses is directly proportional to the intensity of illumination occurring at the photosites or pixels of the sensors.

Such ICCD's are not new in the art of photo optics and they are available, commercially, in a variety of configurations ranging from a few millimeters in linear dimensions to fractional inches. Typical sensors are those of the Fairchild Semiconductor Company known as Model CCD211, and of Radio Corporation of America (RCA), known as Model SID51232.

The former device contains 46,360 photosites or pixels on approximately 23 micron centers, each pixel being approximately $18 \times 14$ microns in dimension over the 4.4 by 5.7 millimeter sensing surface.

The RCA device has, roughly, 163,840 pixels over a sensing surface of 7.3 by 9.7 millimeters.

Most such image sensors are charge coupled devices (CCD's) and are manufactured integral with a multiplexer unit. The pixels are sequentially sampled at frame rates of from 50 to 100 per second by the multiplexer whose output is coupled directly to additional signal processing circuitry. Processing of multiplexer outputs can be accomplished in a variety of modes. In a MEID of several inches on a side, for example, perimeter chips may well serve to trigger operation of close packed arrays internal to the plane as a target image is sensed passing into the plane area. Composite images of focal plane targets may be reconstructed by sequentially sampling individual lines of component chips so that, instead of sampling all pixels of a given chip, certain sections of given chips might be specially processed to provide greater detail and resolution of target data. Processing of chip data is limited only by the imagination of designers and sequences of operation may well be programmed into electronic processors.

Each pixel produces an output signal proportional to the intensity of light (viz. electromagnetic energy) impingent thereon. Optical focusing and collimating equipments condition the energy in the focal plane so that wide aperture lens scanners providing maximum target energy gathering may be integrated with the sensitive ICCD's. By utilizing a plurality of such ICCD's and distributing target energy among them, a manifold increase in resolution of target detail results. While a single chip may well produce the target image upon proper preconditioning of light in the optics for illumination of chip pixels, such use provides excess energy for certain pixels on which detail from two adjacent target points of interest may fall. A large scale focal plane segregates a small portion of the target image for detail processing by a given chip in the focal plane array and provides a high resolution of detail in that portion.

CCD's are highly reliable and useable with low intensity light source targets because of inherent high sensitivity of the individual pixels. Integration of a number of such units into a given MEID combines the good features of sensitivity and reliability with high resolution of target data deriving from each unit's use for portraying a small part of the target.

While the above individual chips function well in their design modes, their sensing surfaces are often too small to provide resolution required for detail analysis of target images. Problems met in arranging these individual ICCD's into large scale focal planes are solved by the materials and processes of this invention.

The primary problem met in developing large-area focal planes utilizing conventional ICCD sensor chips is connection of signal and timing leads between signal processing electronics and the two dimensional detector arrays proper. Existing technology utilizes sandwiches of printed circuit boards with ICCD's place upon the edges of the boards so that wiring between a given chip and its electronics is coupled over the edge of the board to components mounted on the board face. This arrangement requires precise mechanical operations for soldering, optical alinement, shock mounting, vibration isolation, etc., and results in an unacceptably low yield of operational systems. Limitations inherent in the design preclude close packing of the boards and result in unacceptably limited array density as well. Substantial "dead space" in the focal plane is a natural consequence of such packing since no photosites, viz. pixels, occur in those areas of the plane used for isolating the boards, mechanically and electrically, from each other. This, of course, mandates incomplete sensing of the total scene of interest. The MEID described here minimizes this defect.

The within invention overcomes lead connection and mechanical spacing problems in a novel fashion and allows imager chips to be arrayed in extended focal planes of dimensions measured in inches rather than the millimeters of the chips proper.

U.S. patents, including 3,117,260, to Fairchild Semiconductor Co., define and explain the individual imager chips such as are used with this invention. Other U.S. patents such as No. 3,842,492 Method of Providing Conductor Leads for a Semiconductor Body, U.S. Pat. Nos. 3,846,823 Semiconductor Assembly, and 3,821,785 Semiconductor Structure with Bumps, are applicable to parts of this invention. None, however, provides the means for integration of a number of ICCD imager chips into the large scale focal plane of this invention.

Throughout this disclosure, the term superstrate will refer to a body of transparent material interposed between the sensed target and the sensing surface of imager chips. Placed, as it is, between the target and sensing surface, its denomination as superstrate differentiates it from conventional support elements known as substrates.

In embodiments of this invention, an optically transparent superstrate, of selectable transmissivity, is utilized as mechanical support for an array of CCD imager chips. This superstrate similarly supports electrical buses and has electrically conducting standoff pads connected to these buses around its periphery. Each standoff is positioned to mate with electrically conductive pads of the individual CCD chips and provides interconnection of chips with system power, timing and output signals. Bonding pads are provided with braze material coating and, in one of the embodiments, the superstrate is fitted with braze or solder bumps in place of the above standoffs, so that interconnection is achieved by means of the solder bumps proper.

Each standoff and chip pad is brazed or soldered together utilizing conventional flip-chip bonding technology wherein controlled atmospheres and mechanical positioning apparatus allow all CCD chips to be brazed to the superstrate standoffs while they are being held to close tolerance coplanarity with each other. Alternate methods of mounting such radiation sensitive devices to said superstrates may of course be used. As used herein, "braze" or "solder" includes any of such alternate methods. "Braze" or "solder" materials shall also include the materials used in alternate methods.

Figure 3:
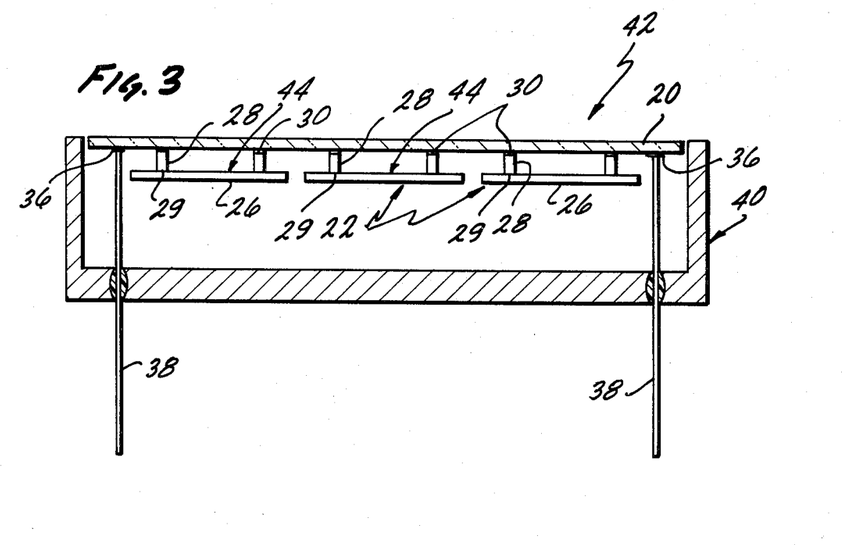
FIG. 3 is a sectional view of a plug-in module showing three imager chips.
Figure 4:
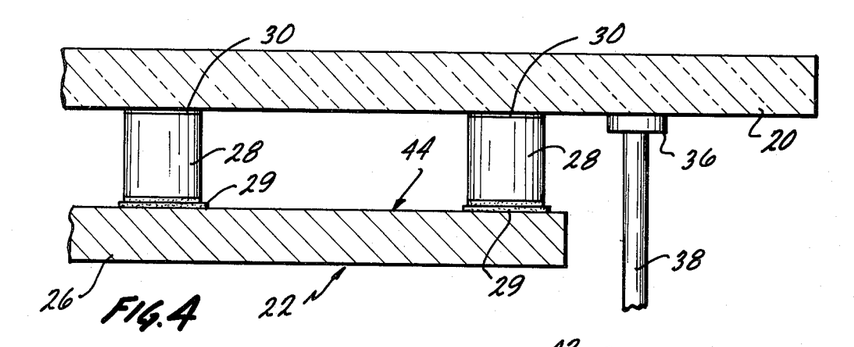
FIG. 4 is an enlarged view of the mounting means used to attach an individual chip to the superstrate and of plug-in module connections to said superstrate.

One of the preferred embodiments of this invention utilizes optically transparent Indium Oxide buses to interconnect devices of the array. Bands of Indium Oxide, a few microns thick, are deposited, in conventional fashion, onto the superstrate in the desired pattern (see FIG. 6). These bands of Indium Oxide, in turn, may terminate in pins of multi-pin plug-in packages for convenience of mounting of individual focal planes (FIG. 3).

Figure 8:
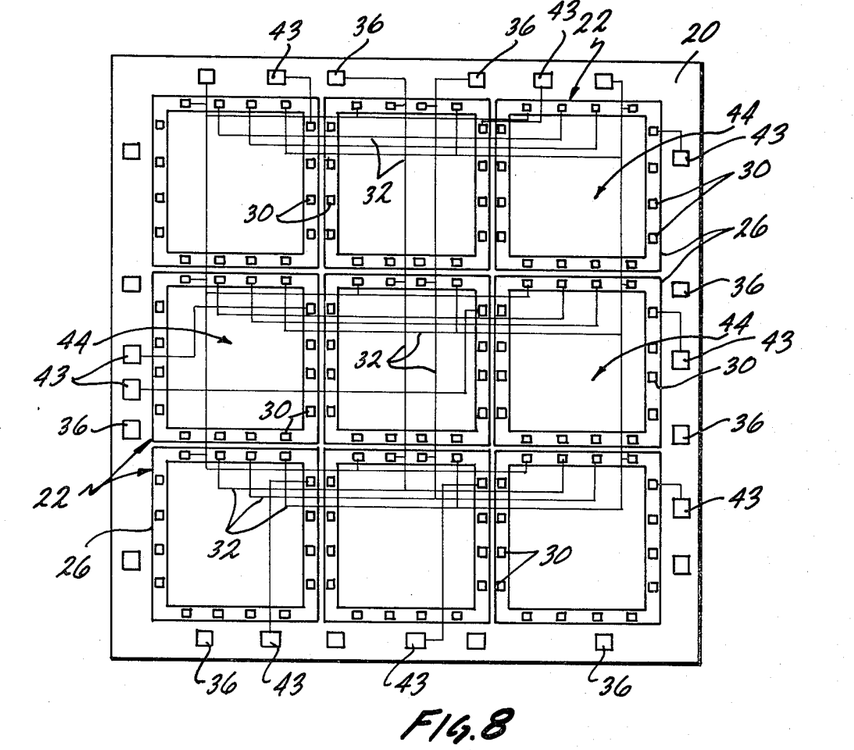
FIG. 8 illustrates the interconnection buses of a nine element MEID.

Electrical buses of the superstrate are designed to interconnect detector chips in parallel fashion for such functions as power and timing. Video output of each chip, however, is bussed to its own separate bonding pad for processing to system requirements (see FIG. 8).

Figure 5:
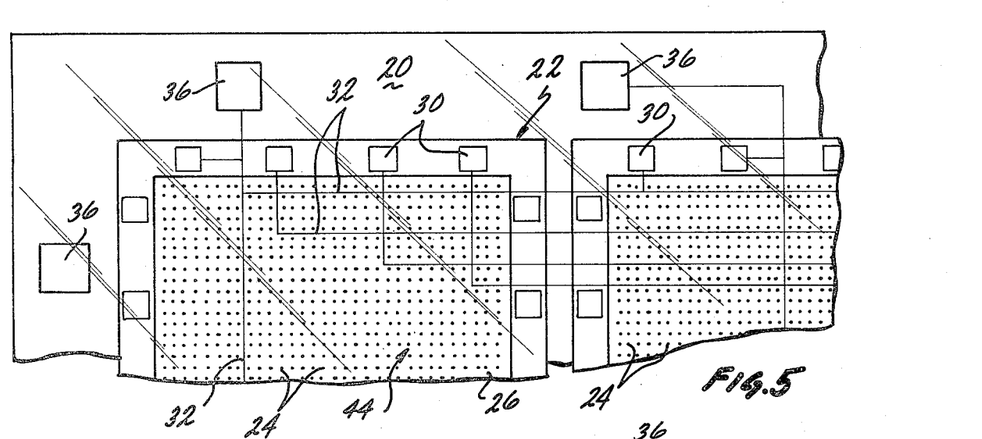
FIG. 5 shows opaque bus lines of a transparent superstrate, said bus lines routed between pixels of the mounted ICCD.
Figure 7:
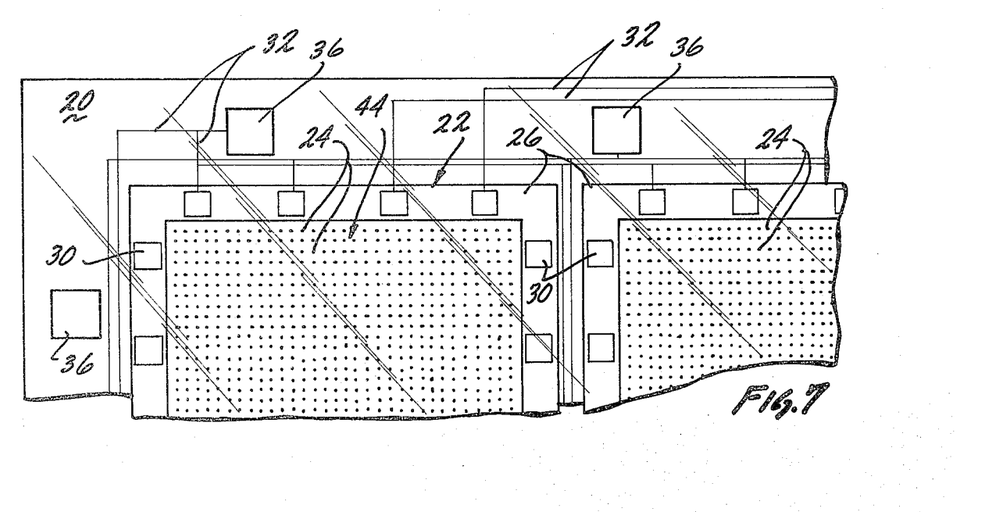
FIG. 7 shows bus lines of a transparent superstrate routed around the periphery of the radiation sensitive devices.

Such a parallel electrical arrangement of buses to interconnect chips of the array eliminates a common single point failure of similar systems wherein open circuit of a critical bus line (timing, power, etc.) resulting from connector pin anomalies or physical damage to a bus line, disables the entire system. For the within device, such circuit defects are compensated by the opposite terminal segment of the bus line which then supports operation entirely on its own.

Where transparent buses are not used, target image integrity is preserved by using opaque bus material routed between chip pixel rows or around the periphery of the chip proper (see FIGS. 5 and 7). Such opaque buses may be as narrow as a few microns of plated conductor and as thin as one or two microns, deposited conventionally on the superstrate during fabrication thereof. It is understood, of course, that the conductors may be of semiconductor material such as doped Germanium, Silicon, Gallium Arsenide, etc. Thin layers of silicon dioxide or other insulative material may be deposited over the buses where desired.

SUMMARY OF THE INVENTION

The within invention utilizes an optically transparent superstrate, of selected transmissivity and of suitable dimensions, as carrier for an array of radiation sensitive devices. Such devices may be similar to those available commercially such as self imaging charge coupled devices (see Description of Prior Art). Device output, in the form of a serial pulse train, resulting from sequential sampling of pixels on the chip face, may be carried to processing electronics externally, with or without use of the superstrate, but as in FIG. 8, a separate output bus 43 may be carried thereon for such a function. This bus, of course, will not have the redundancy of the power, timing and other buses 32 which are connected in parallel.

Use of electrical buses on the superstrate eliminates the need for physical separation of ICCD's to allow passage of operational leads between them. The "sandwich" construction of the prior art noted above, wherein ICCD's are mounted on the edges of printed circuit boards, requires such spacing. That spacing, in turn, results in "dead space" in the focal plane where no sensors exist to complete the target image.

In those applications for which the MEID is used in a focal plane for image sensing and conversion, a plate of sapphire may be used as a superstrate. ICCD's are assembled to such a superstrate by means of a special fixture or jig, designed to hold them fixed in position throughout a brazing operation.

Chips (ICCD's) are placed, sensing surface down on a precision "flat" surface in the pattern to be employed on the superstrate. A compression type jig is placed around the periphery of the pattern and the devices placed in slight compression. Care must be exercised to prevent distortion of the ICCD's. Several inch ounces of compression will allow the chips to support each other in this operation.

Standoffs used to attach ICCD's to their superstrate may be made of any dependably strong material which is not adversely affected by heat of the braze oven. Similarly, such material must not exhibit "outgassing" at vacuums, or other features detrimental to space operations or other critical use functions. A good choice of materials is gold. The standoff may be fixed rigidly to the superstrate so that it becomes, for all practical purposes, part of the superstrate.

Terminal surfaces 29 used for mating with ICCD chip pads must all be coplanar. Chips supported by the standoffs must have their sensing surfaces in a common plane (the focal plane in optics systems) to preclude distortion of sensed target images. This terminal surface 29 may be coated with 2 to 5 mils of braze material which melts at a much lower temperature than does the standoff material.

For gold standoffs, braze material which melts at 220° to 300° C. suffices.

With ICCD's fixed into the jig, the superstrate and ICCD's are heated to the melting point of the braze material. The jig containing the ICCD's is moved under the transparent superstrate so that it is positioned with pads of the individual devices directly opposite standoff terminal surfaces 29. The superstrate is then pressed slightly to the jig and its ICCD's so that braze material is displaced, making a thorough fill of space between pad of the chips and standoff terminal surfaces 29. The oven temperature is lowered to complete the bonding process as braze material solidifies.

To replace a defective ICCD in the MEID, the jig is placed around the array to provide support for unaffected chips and the array is placed in the braze oven with the superstrate down. Gravity assists in preventing previously brazed chips from moving freely. A vacuum actuated probe device is then used on the defective ICCD to lift it from the array. A replacement ICCD may be used with sufficient braze material on its pads so that effective bonding will derive from its placement on the standoff terminal surfaces 29 without rework of such terminal surface. Sensing surface 44 of the replacement ICCD will be coplanar with other array ICCD's by reason of the stability of the standoffs 28 and coplanarity of their terminating surfaces 29. The replacement ICCD is pressed slightly into firm contact of its pads with such surfaces.

For use in focal plane production, the sapphire superstrate is replaced by a sapphire or glass mask with pads in the same location as the terminal surfaces of standoffs of the superstrate. The mask can be recessed to provide holes for the column of the detector, or with a vacuum hold-down. In this way, an entire group of focal plane chips can be exactly positioned before any bonding is done. After the detectors are positioned on the mask, the single device holder is replaced with a vacuum holder that can pick up the entire focal plane at once and lift the sapphire superstrate. The holder is then pressed down on the superstrate while both are heated.

In assembly of chips to the superstrate, precision coplanarity of all ICCD's is easily maintained while standoffs of the superstrate are positioned directly over the braze coated pads thereof. In controlled oven atmosphere of "Forming gas", nitrogen and hydrogen, the assembly is heated to the melting point of braze material, generally about 220 degrees Centigrade. The superstrate is then pressed slightly into the molten braze which is allowed to cool to a strong mechanical and electrically conductive bond. Precision control of chip position under the superstrate is readily maintained throughout the "braze" operation and no mechnical disturbance of either the chips or their supporting superstrate is required by the bonding process.

Electrical buses are integral to the superstrate. In one of the embodiments of this invention, such buses are comprised of thin strips of transparent Indium/Tin Oxide, deposited on the superstrate through conventional processes. These buses are connected, electrically, to proper standoffs on the superstrate and to assembly border pins. Border pins, in turn, are coupled to system power supplies, signal generators or output processing circuitry, as appropriate.

Common function buses supplying power and timing signals to the ICCD's are made redundant by having such power or signals supplied at both ends of the bus, preventing an "open circuit" from occurring as a result of failure, at a given point, along the bus or at corroded or damaged connector pins.

Parallelism of design, wherein all ICCD's are in parallel with respect to power and timing, makes expansion of this type of MEID to large numbers of ICCD's feasible and attractive.

Modularity for use in an extended dimension focal plane is also realizable with this invention wherein a number of ICCD's is assembled to a certain size superstrate assembly and that assembly fitted with plug-in pins (see FIG. 3) to allow a number of such units to be mounted to a chassis, forming thereby a large scale plane. External processing of data attained can readily provide for high resolution optics use of such an extended dimension focal plane.

Superstrates may be fabricated from a variety of materials including glasses, sapphire, crystals, etc., depending on the objective of the user. Transmissivity of the material may well be the controlling criterion for superstrate material selection. Gallium aresenide is highly transparent to electromagnetic energy of wavelengths between 0.8 and 16.0 microns but is opaque to that outside this range. This characteristic can be utilized for its filter effect or as a defense against laser rays and damaging radiation of other types. Superstrates can be designed for selective ranges of energy transmittal and only images radiating within this range will be detected on the focal plane.

Because of their high sensitivity, ICCD's are ideally suited to use in surveillance systems carried by earth orbiting satellites. Optical scanners of earth scenes from orbit are necessarily limited in the amount of radiant energy "capturable" from a given target. Since such targets of interest frequently have a peculiar spectrum of radiant energy, or "fingerprint", a specially selected superstrate material can be used to selectively pass radiation in the bandpass of interest, rejecting all other and thereby increasing the "signal to noise" ratio of processed data without operating electronically on the signal itself (e.g. via amplifiers, filters, etc.).

A particularly attractive application for such a superstrate might well be that of earth surveillance over an area of known and mapped background radiation such as greenery, ice cap, etc.. Here a properly selected or designed superstrate might be used to reject all radiation in the mapped background with only variant radiating images being passed through to the ICCD's.

A similarly attractive, though less exotic, application of the MEID can be found in its use for medical examination by way of X-rays. A few years ago, a large scale X-ray program was conducted in this country, designed to detect breast cancer in American women. Conventional X-ray machines were utilized wherein selective absorption of X-ray energy by body materials allows photographic negatives to be exposed by unabsorbed radiation and so to record discontinuities for analysis by specialists after development via conventional photographic processes.

Hundreds of thousands of women were tested. Subsequent test analysis and followup showed an abnormally high percentage of the tested women had contracted breast cancer. High energy X-rays used in the testing were postulated to have caused the very type of cancer they were designed to detect.

Since ways have not been discovered for focusing X-rays in a focal plane, current practice is to flood the total area of interest with high energy radiation for selective exposure of photographic film by the energy passing through the target area. Insensitivity of photographic film demands that appreciable amounts of energy pass through body tissues to produce intelligible exposure of the photographic plates. As is explained below, imager chips are much more sensitive than photographic paper, require less energy to produce useable output data and hence are operable with lower energy, and less destructive, "soft" X-rays.

Beryllium metal is transparent to radiation in the X-ray portion of the spectrum and low level or "soft" X-rays pass readily through thin plates thereof. Highly sensitive ICCD's configured as a MEID on a beryllium superstrate would allow low level radiation to pass through the subject's tissues and leave an absorption pattern on the MEID corresponding to the position of the device in the radiation field. Signals from the ICCD's would then result from radiation discontinuities caused by anomalies in the intervening subject tissue. ICCD chip output could be recorded electrically for later analysis and radiation danger to the subject minimized. Less radiant energy is required for sensitizing ICCD's than for activation of the photographic film of conventional X-ray systems. The MEID, in this application, would provide a valuable tool for such uses as brain surgery monitoring in real time and industrial processes with semiconductors and devices wherein internal operations could be monitored without risk of object damage from monitoring radiation.

Highly sensitive ICCD's mounted on beryllium superstrates will produce tones and fine detail in X-ray inspection impossible to achieve with the much less sensitive photographic negative exposure method.

Similarly, industrial radiology becomes a viable tool for quality control and critical assembly operations by making low level X-ray energy useable. Beryllium superstrates are mentioned as typical means to utilize ICCD's with X-ray energy but other materials may well provide advantages not available with that metal. Such other materials as are known are comprehended by this disclosure and may also be used in place of the beryllium mentioned herein.

Accordingly, it is an object of this invention to provide a radiation sensitive device through use of a plurality of individual radiation sensitive chips mounted on and supported by a superstrate of selected [optical] electromagnetic radiation transmissivity providing [output electrical] electrical output signals capable of being processed into a reproduction of the electromagnetic image impingent thereon.

An additional object is to provide an extended dimension sensing device capable of providing electrical signals corresponding to the intensity of the electromagnetic signal energy in a focal plane of which the sensing device is part.

A further object of the invention is to provide a large scale focal plane detector device supported by a superstrate comprised of material with selectable transmissivity so that only target energy in the superstrate pass band is allowed to energize detectors thereon.

A still further object of this invention is to provide a multi-element imager device comprised of a plurality of commercially available imager chips so ordered and arrayed on a superstrate as to maximize target sensing area and minimize "dead space" in said sensing area.

Another object of this invention is to provide a detector device sensitive to a fixed band of frequencies electromagnetic energy which provides high resolution and high sensitivity response to signals within that fixed band.

This invention is described in the following drawings by way of example and illustration only and not by limitation.

DESCRIPTION OF PREFERRED EMBODIMENT

Radiation sensitive devices noted herein are sometimes referred to, for convenience only, as Imaging Charge Coupled Devices and it is recognized by the inventor that principles other than "charge coupling" and other photo sensitive detector means may well be utilized. This invention comprehends all such devices.

Figure 1:
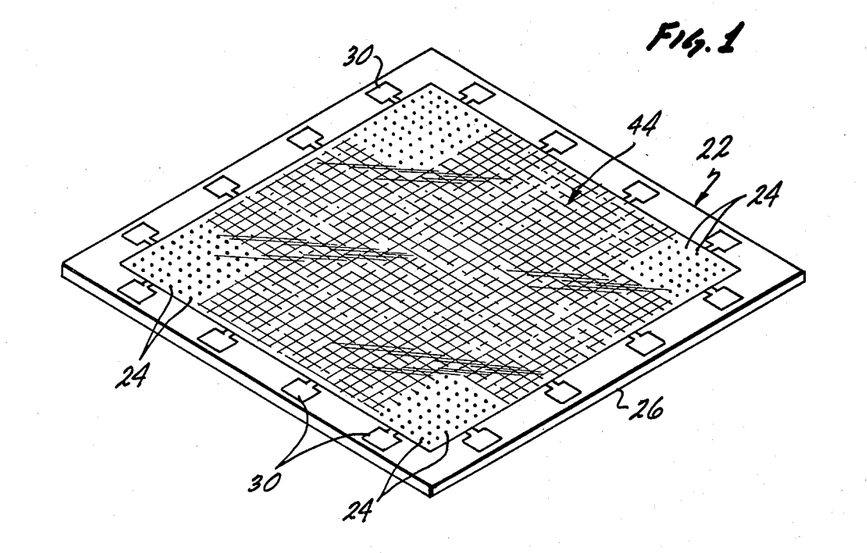
FIG. 1 is an illustration of an imaging chip having the top surface removed at its four corners revealing the underlying pixels. Bonding pads around its periphery are also shown.
Figure 2:
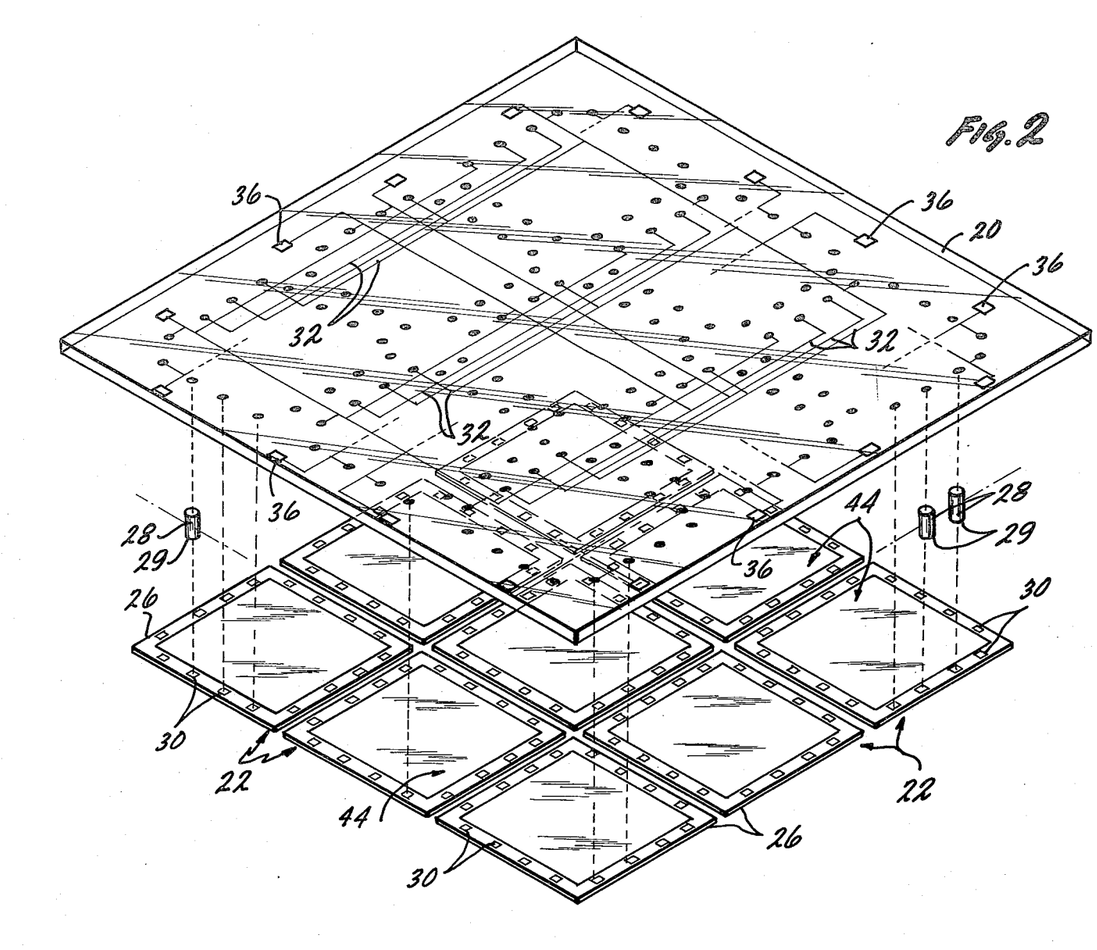
FIG. 2 is an exploded view of a multi-element imager device comprised of nine imager chips with a superstrate and support means.

Fundamental to this invention is a transparent superstrate 20 such as that shown in FIG. 2. Such a superstrate may be of selected transmissivity. Gallium Arsenide, for example, is transparent to electromagnetic energy in the wavelength range of 0.8 to 16 microns, and is essentially opaque to energy of other wavelengths. An alternate material might be chosen as Beryllium which, while opaque to radiation in the visible spectrum, is highly transparent to that of the X-ray and shorter wavelength type. Various glasses, crystals and other compounds exist which meet requirements for transmission of most any selected radiation wavelength.

Figure 6:
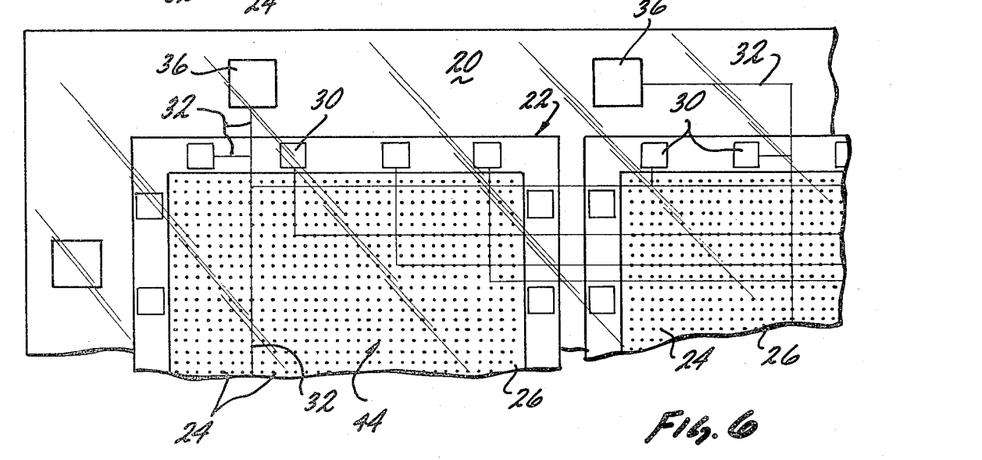
FIG. 6 shows transparent bus lines of a transparent superstrate which bus lines cross the sensing surface of the mounted ICCD.

For a multi-element imager device of dimensions 1.54 inches by 1.74 inches, 64 each ICCD's (Reticon chips)

with a sensing area of 0.192×0.192 inches per chip can be assembled together containing some 65,536 pixels total (see FIGS. 5, 6 & 7). Pixels will be on six mil centers and a sapphire superstrate may be utilized to support the array.

Indium tin oxide bus lines 32 may be deposited on the superstrate to a thickness of 3 to 5 microns or more (see FIG. 6) and may have conductive pads 30 at appropriate intervals along the bus lines. Such conductive pads 30 may be deposited onto the superstrate by any of a number of conventional processes. Their composition will be such that the pads 30 braze well with the gold or other metallic standoffs 28 used to mate with chip carriers 26. Since Indium tin oxide is transparent to visible light, bus lines may be deposited on the sapphire superstrate without regard for position of the pixels underneath. Precision routing of buses is required for metallic or other opaque buses (see FIGS. 5, 6 and 7).

Radiation sensitive devices 22 are mounted on superstrate 20 by means of metallic standoffs 28, which provide the mounting means. Such standoffs are electrical conductors in one embodiment but may be a dielectric coated with a conductor or having electrical conductors thereon.

Superstrates are fabricated so that electrically conductive standoffs 28 are fused to bus lines and to the superstrates. A strong mechanical and electrical bond is established between the two through brazing, soldering or other bonding techniques. Standoff element 28, of FIG. 2, is coated at either end with a thin (2 to 5 mil) coating of low temperature braze or solder material such as tin and tin/solder. The superstrate and standoffs 28 are placed in appropriate braze environments of inert gas and heated until the standoff braze fuses to conductive pads 30 deposited on the superstrate.

Supporting module pins 38 may be brazed to the superstrate at this time as well. Pins 38 are built into a module case 40 to support superstrate 20 and its associated ICCD's. Pins 38 may be routed to power supplies or other signal processing equipments and comprise the principal connection between the large scale focal plane and the system in which that plane is used. Modules 42 may be precision built in any configuration acceptable to the system user. A typical module may have nine ICCD chips mounted on its superstrate and a large scale focal plane may utilize 16 modules in a 4×4 array, or other configuration, to meet requirements of a given mission or objective.

Module support pins 36 are coupled to superstrates 20 at braze pads 36 located around the periphery of superstrates 20. Module case 40 may be light weight plastic or other material to provide a degree of protection for superstrate edges and for sensing surfaces 44 of component ICCD's 22.

Modules 42 are convenient means to utilize this invention which is essentially the combination of a plurality of ICCD's into a functional array useable in the focal plane of an optical scanning and monitoring system.

Scanning optics may be used to cast radiation on the superstrate. Such optics may be conventional and may use the within invention in the focal plane thereof. Telescopes and cameras are typical systems which may also be used in conjunction with this invention. Such equipment may focus the image in the radiation sensitive plane of the device of this invention. The within invention converts this energy into electrical signals.

An X-ray embodiment of the invention would probably not utilize a focal plane system but rather a scanning or moving type, properly indexed to relate position of the MEID to the target body and organs or target images to be studied.

When more than one module 42 is used or where several ICCD's are mounted directly to a superstrate, it is important that sensing surfaces 44 of all ICCD's be coplanar in the optical focal plane of the system. Deviations from coplanarity will result in distortion of the image being converted to electrical signals. Serious consideration must be given to such environmental variables as temperatures and pressures which may distort supporting structure and destroy coplanarity of detector chip surfaces. System designers must set their own accuracy criteria and provide compensation equipments appropriate to the use environment.

Modules 42 comprise one embodiment of MEID's disclosed herein. When modules 42 are used to construct an extended dimension sensor plane, care must be taken to ensure that sockets for conductive pins 38 are suitable to requirements for physical support and coplanarity of sensing surfaces 44. Stable mechanical support and fixed planarity are required for faithful image reproduction by MEID's.

A specific embodiment of the MEID concepts may be effected with 64 ICCD chips built into a common array (i.e. without use of modules 42). Each chip will measure 0.192 inches on a side in an 8×8 array measuring 1.54 inches on a side. Such an array (utilizing Reticon ICCD's) provides 65,536 pixels. System connections for timing and power signals are made at standoff elements 28 positioned around the periphery of the array. Useable for infra-red image detection, the above array provides multiplexers smaller in dimensions than sensing surfaces 44 and with the component ICCD's bonded to their superstrate through small dimension flip chip bumps, the resulting MEID has minimal "dead space".

Standoffs 28 may be fabricated of any stable, conductive material. In those embodiments described herein, precision elements were made from gold, for corrosion and stability qualities, with a 2 to 5 mil braze coating of low temperature braze material of tin/solder. While special care must be taken to preserve coplanarity of component chips, MEID's of this invention may be fabricated using well established techniques of chip processing and flip chip bonding.

Although specific embodiments of the invention have been described, other embodiments, modifications and the like are intended to be encompassed within the scope of the invention:

What is claimed is:

1. In combination, a plurality of radiation sensitive devices, a transparent superstratum, electrical conductor means carried by said superstratum and mounting means attaching said radiation sensitive devices to said superstratum, said mounting means providing electrical connections between said radiation sensitive devices and said electrical conductor means.

2. The combination recited in claim 1 wherein said electrical conductor means are transparent to electromagnetic radiation at those locations where radiation is to be transmitted through said conductor means to said devices.

3. The combination recited in claim 1 wherein mounting means comprises bumps of electrically conductive braze or solder material.

4. The combination recited in claim 1 wherein said radiation sensitive devices are attached to said superstratum so that the sensitive surfaces are optically aligned.

5. The combination recited in claim 1 wherein said superstratum is transparent to only a fixed band of frequencies in the electromagnetic spectrum.

6. The combination recited in claim 1 wherein said superstratum has electrically conductive standoffs affixed thereto and wherein said radiation sensitive devices have electrically conductive pads, said standoffs and pads being so disposed that each standoff is positioned to correspond with the location of a pad on a radiation sensitive device, said standoffs and pads being electrically and mechanically coupled by means of electrically conductive, fusible material.

7. The combination recited in claim 6 wherein said standoffs and pads are metallic and are formed of a metal from the class consisting of gold, silver, copper and nickel and said braze material is one from the class consisting of tin, indium and lead/tin allow.

8. The combination recited in claim 1 wherein said electrical conductor means are comprised, at least in part, of semi-conductor material.

9. The combination recited in claim 1 wherein said superstratum is mounted to a case fitted with electrically conductive and mechanically supportive pins forming a superstrate assembly mountable to a chassis.

10. The combination recited in claim 1 wherein said electrical conductor means are transparent to radiation and integral with said superstratum and wherein said mounting means comprises an electrically conductive braze bond between said electrical conductor means and said radiation sensitive devices.

11. The combination recited in claim 1 wherein said electrical conductor means, are opaque to radiation, said means comprising narrow strips of conductive material positioned on said superstrate so as to lie opposite areas of said devices not containing photosensitive pixels and said devices are electrically and mechanically coupled to said superstratum by braze bonds between said electrical conductor means and said radiation sensitive devices.

12. The combination recited in claim 1 wherein said devices include electrical conductors connected to electrically conductive pads and wherein said mounting means comprise metallic standoffs braze bonded to said conductive pads.

13. The combination recited in claim 1 wherein radiation sensitive surfaces of said devices lie in a common plane adjacent said transparent superstratum.

14. In combination, a plurality of radiation sensitive devices with planar sensing surfaces, a transparent superstratum having a planar surface, electrically conductive bus lines integral with said superstratum, and electrically conductive standoffs, said standoffs so braze-bonded between said bus lines and said devices that sensing surfaces of all devices lie in a plane parallel with the planar surface of said superstratum.

* * * * *